United States Patent
Jojima et al.

(10) Patent No.: US 10,454,375 B2
(45) Date of Patent: Oct. 22, 2019

(54) POWER CONVERTER

(71) Applicant: TOYOTA JIDOSHA KABUSHIKI KAISHA, Toyota-shi, Aichi (JP)

(72) Inventors: Yuki Jojima, Nagoya (JP); Shuichi Iwata, Nisshin (JP); Hiromi Yamasaki, Toyota (JP); Takanori Kawashima, Anjo (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 0 days.

(21) Appl. No.: 16/267,624

(22) Filed: Feb. 5, 2019

(65) Prior Publication Data

US 2019/0245443 A1 Aug. 8, 2019

(30) Foreign Application Priority Data

Feb. 6, 2018 (JP) .................. 2018-019601

(51) Int. Cl.
  *H02M 3/00* (2006.01)
  *H02M 3/158* (2006.01)
  *H02M 7/00* (2006.01)

(52) U.S. Cl.
  CPC ......... *H02M 3/1584* (2013.01); *H02M 7/003* (2013.01)

(58) Field of Classification Search
  CPC .......................... H02M 3/1584; H02M 7/003
  See application file for complete search history.

(56) References Cited

U.S. PATENT DOCUMENTS

| 2003/0030481 | A1 | 2/2003 | Oumaru |
| 2004/0060692 | A1* | 4/2004 | Pfeifer ............... H02M 7/003 361/704 |
| 2009/0201708 | A1 | 8/2009 | Ohkouchi et al. |
| 2013/0113090 | A1 | 5/2013 | Atsumi |

FOREIGN PATENT DOCUMENTS

| JP | 5541362 B2 | 7/2014 |
| JP | 2016-096620 A | 5/2016 |

* cited by examiner

*Primary Examiner* — Adolf D Berhane
*Assistant Examiner* — Afework S Demisse
(74) *Attorney, Agent, or Firm* — Sughrue Mion, PLLC

(57) ABSTRACT

A power converter may include a first and second housings, each of which houses switching elements connected in parallel. Each of the first and the second housings may be provided with a first surface and a second surface. The first and the second housings may be arranged face to face. In each of the first and the second housings, the switching elements may be aligned in an alignment direction which is parallel to both of the first and the second surfaces. An emitter terminal or a source terminal of parallel connection of the switching elements may extend from the second surface at a position equidistant from the switching elements positioned at both ends in the alignment direction among the plurality of switching elements. A collector terminal or a drain terminal of the parallel connection may be positioned adjacent to the emitter or the source terminal in the alignment direction.

5 Claims, 9 Drawing Sheets

POWER CONVERTER

CROSS-REFERENCE TO RELATED APPLICATIONS

This application claims priority to Japanese Patent Application No. 2018-019601 filed on Feb. 6, 2018, the contents of which are hereby incorporated by reference into the present application.

TECHNICAL FIELD

A technique disclosed herein relates to a power converter. In particular, the technique disclosed herein relates to a power converter that includes a plurality of housings each of which houses a plurality of switching elements connected in parallel.

BACKGROUND

In some cases, a power converter, such as an inverter or a bidirectional DC-DC converter, may include multiple sets of series connections each including two switching elements. A housing configured to house two switching elements is suitable for such a power converter. Japanese Patent Application Publication No. 2016-96620 describes a power converter in which a plurality of housings, each of which houses two switching elements, is stacked. In each of the housings, the two switching elements are connected in series.

SUMMARY

To reduce a load on switching elements, the switching elements may be connected in parallel. In this case, a housing configured to house a plurality of switching elements connected in parallel is suitable. In a case of using such housings in a circuit that requires series connection of switching elements, two of such housings, each of which houses parallel connection of the switching elements, are connected in series. The disclosure herein provides a suitable structure for a power converter in which housings each house a plurality of switching elements connected in parallel and these housings are connected in series.

A power converter disclosed herein may include a first housing and a second housing. Each of the first housing and the second housing may house a plurality of switching elements connected in parallel. Each of the first housing and the second housing may be provided with a first surface and a second surface which intersects with the first surface. The first and the second housings may be arranged such that the first surface of the first housing faces the first surface of the second housing. In other words, the first and the second housings are arranged face to face (back to back).

In each of the first housing and the second housing, the plurality of switching elements may be aligned in a direction parallel to both of the first and the second surfaces. For convenience of description, the direction in which the switching elements are aligned will hereinafter be referred to as an "alignment direction". An emitter terminal or a source terminal of parallel connection of the plurality of switching elements may extend from the second surface at a position equidistant from the switching elements positioned at both ends in the alignment direction among the plurality of switching elements. A collector terminal or a drain terminal of the parallel connection may be positioned adjacent to the emitter or the source terminal in the alignment direction.

In each of the housings in the above power converter, the emitter or the source terminal is equidistant from the switching elements positioned at the both ends in the alignment direction. The above structure can therefore reduce variations in currents that flow in the plurality of switching elements connected in parallel.

A typical example of the housings is a power module. The "housing" will hereinafter be represented as a "power module" for easier understanding. Moreover, in the parallel connection of the plurality of switching elements, a terminal of the power module that is connected to emitter electrodes of the plurality of switching elements (source electrodes thereof in a case of a MOSFET) will hereinafter be referred to as a "negative terminal", and a terminal of the power module that is connected to collector electrodes of the plurality of switching elements (drain electrodes thereof in the case of a MOSFET) will hereinafter be referred to as a "positive terminal", for easier understanding.

The first and the second power modules are connected in series. In a case where the positive terminal of the second power module and the negative terminal of the first power module are connected, the positive and the negative terminals are connected by a conductor (an inter-module bus bar). At this time, arranging the first and the second power modules face to face (back to back) results in that the negative terminal of the second power module and the positive terminal of the first power module are positioned on a same side relative to the inter-module bus bar in the alignment direction. The negative terminal of the second power module and the positive terminal of the first power module, namely, a positive side and a negative side of the series connection, are often connected in parallel to another device (e.g., a capacitor or another power module). When the negative terminal of the second power module and the positive terminal of the first power module are positioned on the same side relative to the inter-module bus bar, a connection structure with another device is simplified.

Typically, the inter-module bus bar may have the following shape. The inter-module bus bar, which extends from another device, includes a base portion connected to the positive terminal of the second power module, a middle portion bent at an end of the base portion toward the first power module, and an end portion bent at an end of the middle portion so as to face the negative terminal of the first power module and connected to the negative terminal of the first power module. The inter-module bus bar, which is bent twice, connects the two power modules in series. Typically, the inter-module bus bar may be bent in a crank shape.

The details and further modifications of the technique disclosed herein will be described in the following "DETAILED DESCRIPTION OF INVENTION".

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved power converter.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiment

Figure 1:
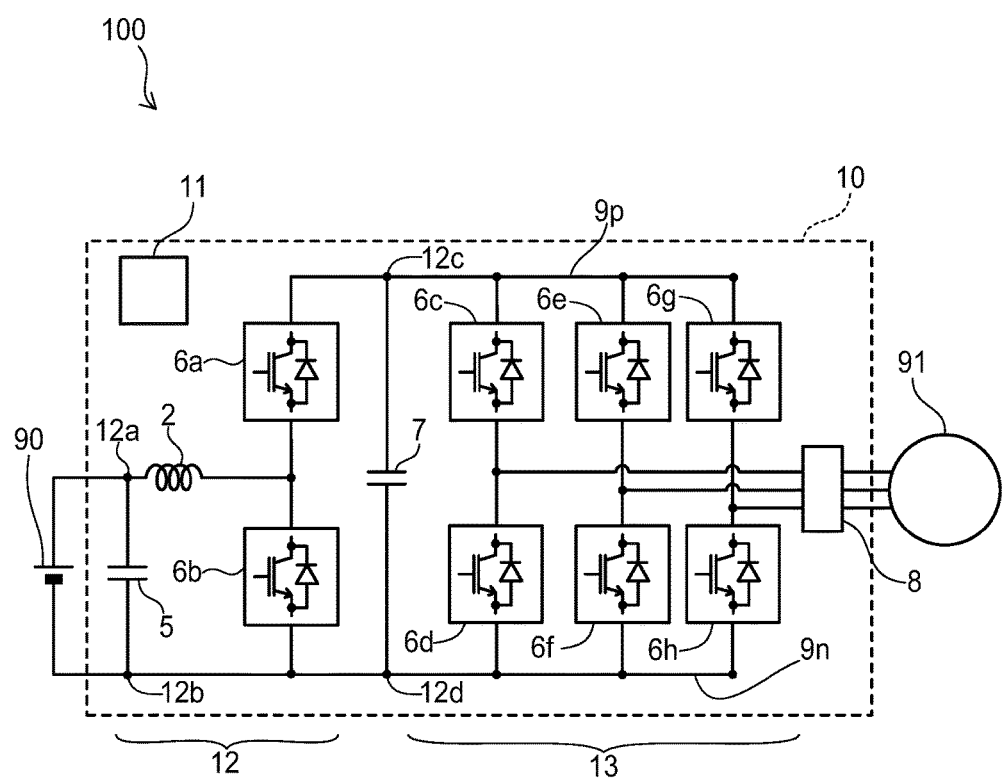
FIG. 1 is a circuit diagram of an electric vehicle that includes a power converter of an embodiment.

With reference to the drawings, a power converter 10 of an embodiment will be described. The power converter 10 of the embodiment is mounted on an electric vehicle 100. FIG. 1 shows a block diagram of a power system of the electric vehicle 100 that includes the power converter 10. The power converter 10 steps up a voltage of power of a battery 90, and further converts the power into an alternating current. The alternating current power, which is outputted by the power converter 10, is supplied to an electric traction motor 91.

The power converter 10 includes a voltage converter circuit 12, an inverter circuit 13, a smoothing capacitor 7, a current sensor 8, and a controller 11. The voltage converter circuit 12 has a step-up function of stepping up a voltage of the battery 90 and supplying it to the inverter circuit 13, and a step-down function of stepping down regenerative power transmitted from the inverter circuit 13 (power generated by the electric traction motor 91) and supplying it to the battery 90. The voltage converter circuit 12 is a so-called bidirectional DC-DC converter.

The voltage converter circuit 12 includes a filter capacitor 5, a reactor 2, two switching circuits 6a, 6b, and the controller 11. Each of the switching circuits 6a, 6b is a power module. Each of the switching circuits 6a, 6b is a circuit in which three switching elements are connected in parallel, and each of the switching elements is connected in inverse parallel with a diode. The switching circuits 6a, 6b operate as if they were one switching element. A circuit configuration and a hardware structure of the switching circuits 6a, 6b will be described later. Each of the switching circuits 6a, 6b is herein treated as an inverse parallel circuit including one switching element and one diode. FIG. 1 thus depicts one transistor and one diode in a rectangle that represents each of the switching circuits 6a, 6b.

The two switching circuits 6a, 6b are connected in series between high-voltage side 12c, 12d of the voltage converter circuit 12. The reactor 2 has its one end connected to a midpoint of the series connection of the switching circuits 6a, 6b, and has the other end connected to a positive terminal 12a of a low-voltage side of the voltage converter circuit 12. A negative terminal 12b of a low-voltage side and a negative terminal 12d of the high-voltage side of the voltage converter circuit 12 are directly connected. The filter capacitor 5 is connected between the positive terminal 12a of the low-voltage side and the negative terminal 12b of the low-voltage side of the voltage converter circuit 12. The switching element in the switching circuit 6a is involved in a step-down operation, and the switching element in the switching circuit 6b is involved in a step-up operation. When the switching circuits 6a, 6b are driven by complementary PWM signals, the step-down and the step-up operations are switched passively in accordance with a voltage balance between the low-voltage side terminals 12a, 12b and the high-voltage side terminals 12c, 12d. The complementary PWM signals mean to supply a driving signal to one of the switching elements and to supply, to the other of the switching elements, another driving signal whose high level and low level are reversed as compared to the driving signal supplied to the one of the switching element.

The inverter circuit 13 includes six switching circuits 6c to 6h. The switching circuits 6c to 6h each have the same structure as that of the switching circuit 6a. The switching circuits 6c, 6d are connected in series, the switching circuits 6e, 6f are connected in series, and the switching circuits 6g, 6h are connected in series. The three sets of series connections (series connections each including the two switching circuits) are connected in parallel between a positive line 9p and a negative line 9n. An alternating current is outputted from a midpoint of each of the series connections.

A structure and an operation of each of the voltage converter circuit 12 and the inverter circuit 13 in FIG. 1 are well known, and thus the detailed description thereof will be omitted. The smoothing capacitor 7 is connected between the voltage converter circuit 12 and the inverter circuit 13.

The power converter 10 includes the current sensor 8 that measures a three-phase alternating current outputted by the inverter circuit 13 for each phase. The power converter 10 also includes the controller 11 that drives the eight switching circuits 6a to 6h.

The switching circuits 6a, 6b in the voltage converter circuit 12 are also connected in series between the positive and the negative lines 9p, 9n. The power converter 10 shown in FIG. 1 is provided with four sets of series connections each including two switching circuits, and the four sets of series connections are connected in parallel between the positive and the negative lines 9p, 9n. The smoothing capacitor 7 is also connected between the positive and the negative lines 9p, 9n. The switching circuits 6a to 6h have the same structure. When described without distinction from each other, the switching circuits 6a to 6h will hereinafter be denoted as switching circuits 6. As mentioned before, in each one of the switching circuits 6, a plurality of switching elements is connected in parallel. Each one of the switching circuits 6 is implemented by one power module. Next, a power module suitable for the circuit in FIG. 1 and a suitable connection structure for a plurality of power modules will be described.

Figure 2:
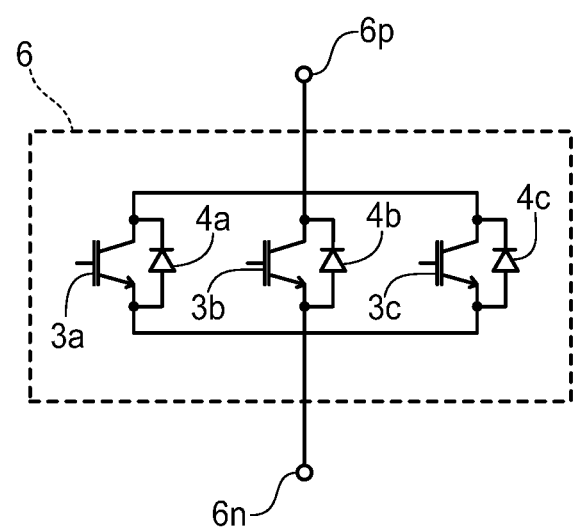
FIG. 2 is a circuit diagram in a power module.

FIG. 2 shows a circuit diagram of one of the switching circuits 6. In the switching circuit 6, three switching elements 3a to 3c are connected in parallel, and diodes 4a to 4c are connected in inverse parallel with the switching elements 3a to 3c, respectively. In the parallel connection of the three switching elements 3a to 3c, a terminal on its collector side is referred to as a positive terminal 6p, and a terminal on its emitter side is referred to as a negative terminal 6n.

The controller 11 in the power converter 10 supplies identical driving signals to the three switching elements 3a to 3c included in the switching circuit 6. The three switching elements 3a to 3c are of identical types and have identical characteristics. Similarly, the three diodes 4a to 4c are of identical types and have identical characteristics. The identical driving signals are supplied to the three switching elements 3a to 3c connected in parallel, so the three switching elements 3a to 3c operate as if they were one switching element. The parallel circuit of the three switching elements 3a to 3c can allow a current three times as large as an allowable current in one switching element. Connecting a plurality of switching elements in parallel enables a load per switching element to be reduced. In other words, connecting a plurality of switching elements in parallel can implement a power converter capable of handling a large current.

Figure 3:
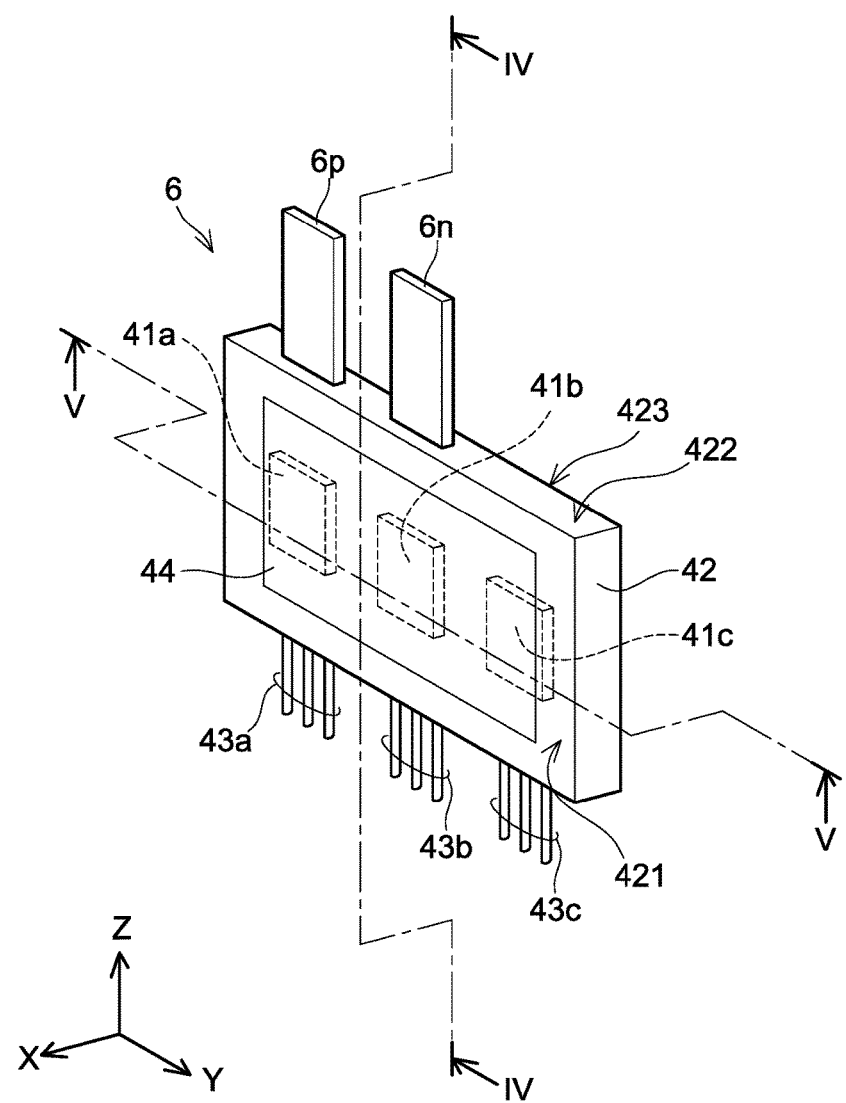
FIG. 3 is a perspective view of the power module.

Each switching circuit 6 is implemented by one power module. The switching circuits 6 will hereinafter be alternatively referred to as power modules 6. FIG. 3 shows a perspective view of one of the power modules 6. The power module 6 includes a package 42 constituted of resin as a main body. The package 42 (the power module 6) has a flat shape. For convenience of description, one wide surface of the package 42 (the power module 6) is referred to as a first surface 421, one narrow surface intersecting with the first surface 421 is referred to as a second surface 422, and a wide surface parallel to the first surface 421 is referred to as a third surface 423. In other words, the power module 6 is a card-type device provided with a pair of wide surfaces (the first and the third surfaces 421, 423), and a narrow surface (the second surface 422) intersecting with both of the pair of wide surfaces.

Three semiconductor chips 41a to 41c are embedded in the package 42. Each of the semiconductor chips 41a to 41c is a reverse-conducting insulated gate bipolar transistor (RC-IGBT) chip in which an IGBT (a switching element) and a diode are connected in inverse parallel with each other on one substrate. The semiconductor chip 41a therefore implements the inverse parallel circuit of the switching element 3a and the diode 4a in the circuit diagram in FIG. 2.

A metal heat dissipating plate (a first heat dissipating plate 44) is exposed at the first surface 421 of the package 42. Although hidden and not shown in FIG. 3, another heat dissipating plate (a second heat dissipating plate 45) is exposed at the third surface 423 opposite to the first surface 421. The positive and the negative terminals 6p, 6n extend from the second surface 422 intersecting with the first surface 421. The positive terminal 6p is a terminal connected to collector electrodes 413 (described later) of the three semiconductor chips 41a to 41c. The negative terminal 6n is a terminal connected to emitter electrodes 412 (described later) of the three semiconductor chips 41a to 41c.

An X direction in a coordinate system in the drawing coincides with a normal direction of the first surface 421 of the power module 6. A Y direction in the coordinate system coincides with a longitudinal direction of the elongated second surface 422. The positive and the negative terminals 6p, 6n are provided to align in the Y direction. The Y direction may hereinafter be referred to as an "alignment direction". The negative terminal 6n is provided at a center of the second surface 422 in the alignment direction, and the positive terminal 6p is provided adjacent to the negative terminal 6n in the alignment direction.

Control terminals 43a to 43c extend from a narrow surface opposite to the second surface 422. The control terminals 43a are terminals of the semiconductor chip 41a and include a terminal electrically conductive with a gate electrode, a terminal electrically conductive with a temperature sensor that measures a temperature in the semiconductor chip, a terminal electrically conductive with a sense emitter of the switching element, and the like. The control terminals 43b are terminals of the semiconductor chip 41b, and the control terminals 43c are terminals of the semiconductor chip 41c.

Figure 4:
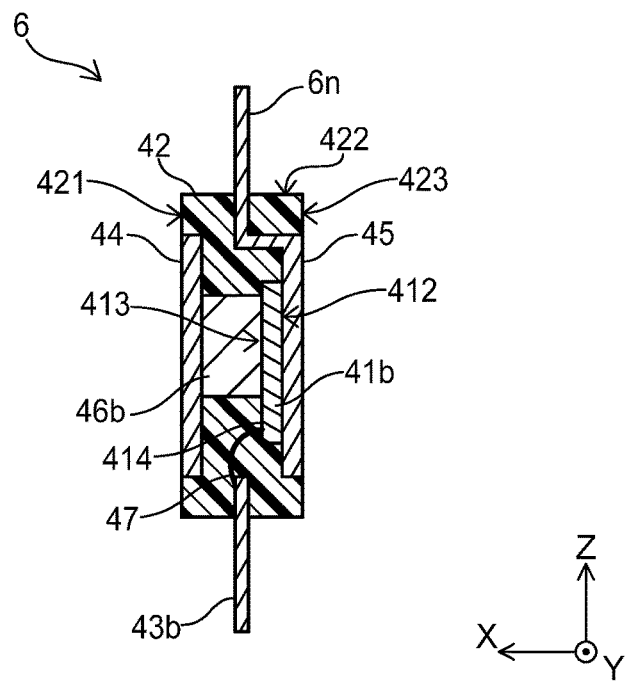
FIG. 4 is a cross-sectional view of the power module along a line IV-IV in FIG. 3.
Figure 5:
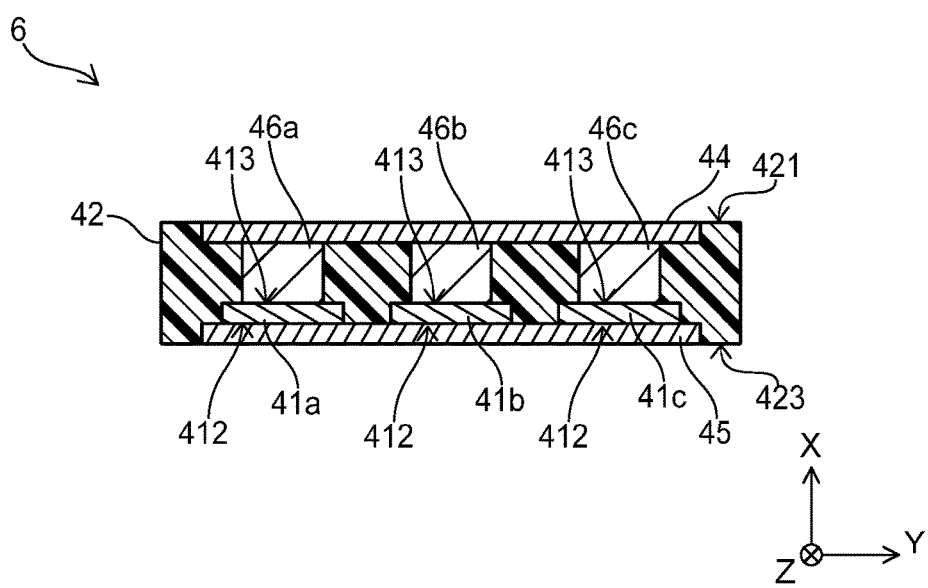
FIG. 5 is a cross-sectional view of the power module along a line V-V in FIG. 3.

FIG. 4 shows a cross-sectional view of the power module 6 along a line IV-IV in FIG. 3, and FIG. 5 shows a cross-sectional view of the power module 6 along a line V-V in FIG. 3. FIG. 4 shows a cross section that traverses the central semiconductor chip 41b. FIG. 5 shows a cross section that traverses the three semiconductor chips 41a to 41c. As mentioned before, the first heat dissipating plate 44 is exposed at the first surface 421 of the package 42, and the second heat dissipating plate 45 is exposed at the third surface 423 of the package 42. In the package 42, the semiconductor chips 41a to 41c and spacer blocks 46a to 46c are interposed between the first and the second heat dissipating plates 44, 45. The heat dissipating plates 44, 45 and the spacer blocks 46a to 46c are constituted of conductive metal (typically, copper).

Each of the semiconductor chips 41a to 41c is of a flat plate type, has the emitter electrode 412 provided on one wide surface thereof, and has the collector electrode 413 and electrode pads 414 provided on the other wide surface thereof. The emitter electrodes 412 of the semiconductor chips 41a to 41c are bonded to the second heat dissipating plate 45. The collector electrodes 413 of the semiconductor chips 41a to 41c are connected to the spacer blocks 46a to 46c, respectively. The spacer blocks 46a to 46c are bonded to the first heat dissipating plate 44 on their sides opposite to the collector electrodes 413. The heat dissipating plates 44, 45 have electrical conductivity. The first heat dissipating plate 44 is electrically conductive with the collector electrodes 413 of the semiconductor chips 41a to 41c, and the second heat dissipating plate 45 is electrically conductive with the emitter electrodes 412 of the semiconductor chips 41a to 41c. In other words, the heat dissipating plates 44, 45 connect the three semiconductor chips 41a to 41c in parallel.

As shown in FIG. 4, the electrode pads 414 of the semiconductor chip 41b are connected to the control terminals 43b via bonding wires 47.

As shown in FIG. 4, the second heat dissipating plate 45 is connected to the negative terminal 6n in the package 42. The second heat dissipating plate 45 is exposed at the wide surface (the third surface 423) of the package 42, and has functions to dissipate heat of the semiconductor chips 41a to 41c and to connect the emitter electrodes 412 of the semiconductor chips 41a to 41c in parallel. Similarly, the first heat dissipating plate 44 has functions to dissipate heat of the semiconductor chips 41a to 41c and to connect the collector electrodes 413 of the semiconductor chips 41a to 41c in parallel.

The semiconductor chips 41a to 41c are arranged at regular intervals in the package 42. The semiconductor chip 41b is positioned at a center of the package 42 in the alignment direction. As mentioned before, the negative terminal 6n is provided at the center of the second surface 422 of the power module 6 (the package 42) in the alignment direction. Therefore, the negative terminal 6n is at a position equidistant from the emitter electrodes 412 of the semiconductor chips 41a, 41c positioned at both ends of the alignment of the semiconductor chips 41a to 41c. Next, advantages obtained by this structural feature will be described.

Figure 6:
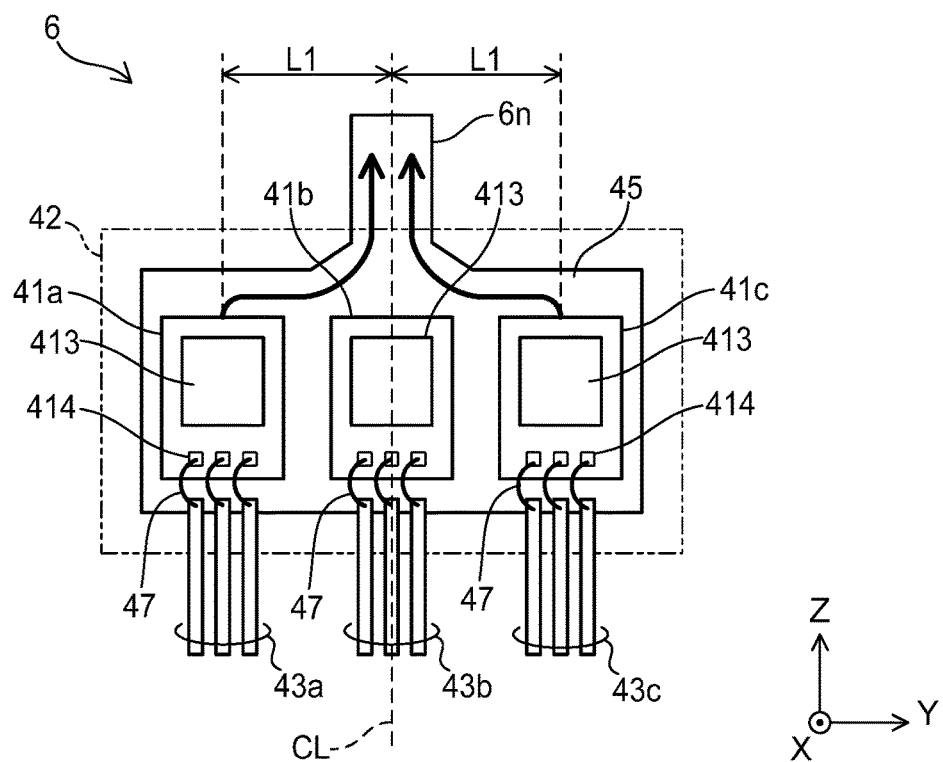
FIG. 6 is a plan view of the power module with a first heat dissipating plate 44 and a package 42 removed.

FIG. 6 shows a plan view of the power module 6 with the package 42 and the first heat dissipating plate 44 removed. As mentioned before, the X direction in the coordinate system in the drawing corresponds to the normal direction of the first surface 421, and the Y direction corresponds to the alignment direction. FIG. 6 shows an internal structure of the power module 6 seen in the normal direction of the first surface 421. The three semiconductor chips 41a to 41c are arranged in a line at regular intervals in the alignment direction, and the negative terminal 6n is positioned at the center of the second surface 422 in the alignment direction. A dashed line CL in FIG. 6 is a center line of the power module 6 seen in the normal direction of the first surface 421. In other words, the dashed line CL is the center line of the power module 6 in the alignment direction.

The three semiconductor chips 41a to 41c are aligned in the alignment direction so as to be line symmetric with respect to the center line CL, and the negative terminal 6n extends along the center line CL at the center of the alignment direction. An overall layout of the three semiconductor chips 41a to 41c and the negative terminal 6n is line symmetric with respect to the center line CL. In this layout, a distance from the semiconductor chip 41a, which is positioned at one end of the alignment of the semiconductor chips, to the negative terminal 6n is equal to a distance from the semiconductor chip 41c, which is positioned at the other end of the alignment of the semiconductor chips, to the negative terminal 6n. In other words, the negative terminal 6n is positioned equidistant from the emitter electrodes 412 of the semiconductor chips (the semiconductor chips 41a, 41c) positioned at the both ends of the alignment of the semiconductor chips 41a to 41c. In FIG. 6, the emitter electrodes 412 are arranged at the surfaces of the semiconductor chips 41a to 41c opposite to the surfaces where the collector electrodes 413 are arranged. Arrows indicated by a sign "L1" in FIG. 6 show that the distance from the semiconductor chip 41a to the negative terminal 6n is equal to the distance from the semiconductor chip 41c to the negative terminal 6n.

The above layout makes currents that flow from the emitter electrodes of the semiconductor chips 41a, 41c equal. Bold arrows in FIG. 6 schematically represent the current that flows from the semiconductor chip 41a to the negative terminal 6n and the current that flows from the semiconductor chip 41c to the negative terminal 6n, respectively. The two bold arrows are drawn to be line symmetric with respect to the center line CL. This shows that the currents that flow from the emitter electrodes 412 of the semiconductor chips 41a, 41c are made equal.

A case is assumed in which the negative terminal 6n is arranged immediately above the semiconductor chip 41a. In this case, the negative terminal 6n is at the shortest distance from the semiconductor chip 41a, is at the second shortest distance from the semiconductor chip 41b, and is at the longest distance from the semiconductor chip 41c. Consequently, the semiconductor chips 41a, 41c are at significantly different distances from the negative terminal 6n, by which imbalance is caused in currents flowing therein.

The three semiconductor chips 41a to 41c are driven by the identical driving signals, and behave as if they were one switching element. Connecting the three semiconductor chips 41a to 41c in parallel can reduce a load per semiconductor chip. It is therefore preferable that currents flow equally in the three semiconductor chips 41a to 41c. By aligning the three semiconductor chips 41a to 41c in a line in the alignment direction and arranging the negative terminal 6n at a position equidistant from the semiconductor chips positioned at the both ends of the alignment of the semiconductor chips, variations in currents flowing in the three semiconductor chips 41a to 41c can be reduced.

Figure 7:
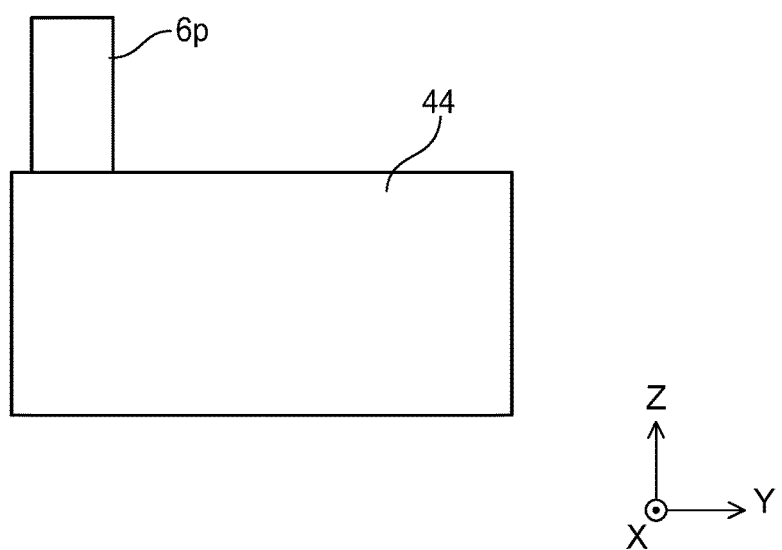
FIG. 7 is a plan view of the first heat dissipating plate 44.

FIG. 7 shows a plan view of the first heat dissipating plate 44. The first heat dissipating plate 44 has the positive terminal 6p connected thereto. The positive terminal 6p is positioned adjacent to the negative terminal 6n in the alignment direction of the second surface 422 of the package 42. The positive terminal 6p is at the shortest distance from the semiconductor chip 41a, is at the second shortest distance from the semiconductor chip 41b, and is at the longest distance from the semiconductor chip 41c. The positive terminal 6p is at different distances from the three semiconductor chips 41a to 41c. Small variations in distances from the negative terminal 6n to the semiconductor chips is more effective for reduction in current differences than small variations in distances from the positive terminal 6p to the semiconductor chips. This is because variations in currents that flow in semiconductor chips are more affected by variations in resistances on a downstream side of the currents in the semiconductor chips than by variations in resistances on an upstream side of the currents in the semiconductor chips. Therefore, by arranging the negative terminal 6n at a position equidistant from the emitter electrodes of the semiconductor chips positioned at the both ends of the alignment of the semiconductor chips, variations in currents that flow in the three semiconductor chips 41a to 41c can be effectively suppressed.

Each of the semiconductor chips 41a to 41c of the embodiment is an n-channel type IGBT, and its gate voltage is defined with respect to an emitter potential. In this case, in order to suppress gate oscillations when the plurality of semiconductor chips 41a to 41c is simultaneously driven, the semiconductor chips 41a to 41c preferably have emitter potentials as equal as possible. In the power converter 10 of the embodiment, the negative terminal 6n is equidistant from the emitter electrodes of the semiconductor chips 41a, 41c positioned at the both ends of the alignment of the semiconductor chips, so variations in emitter potentials of the plurality of semiconductor chips 41a to 41c are suppressed. The power converter 10 of the embodiment also achieves an effect of suppressing gate oscillations.

Figure 8:
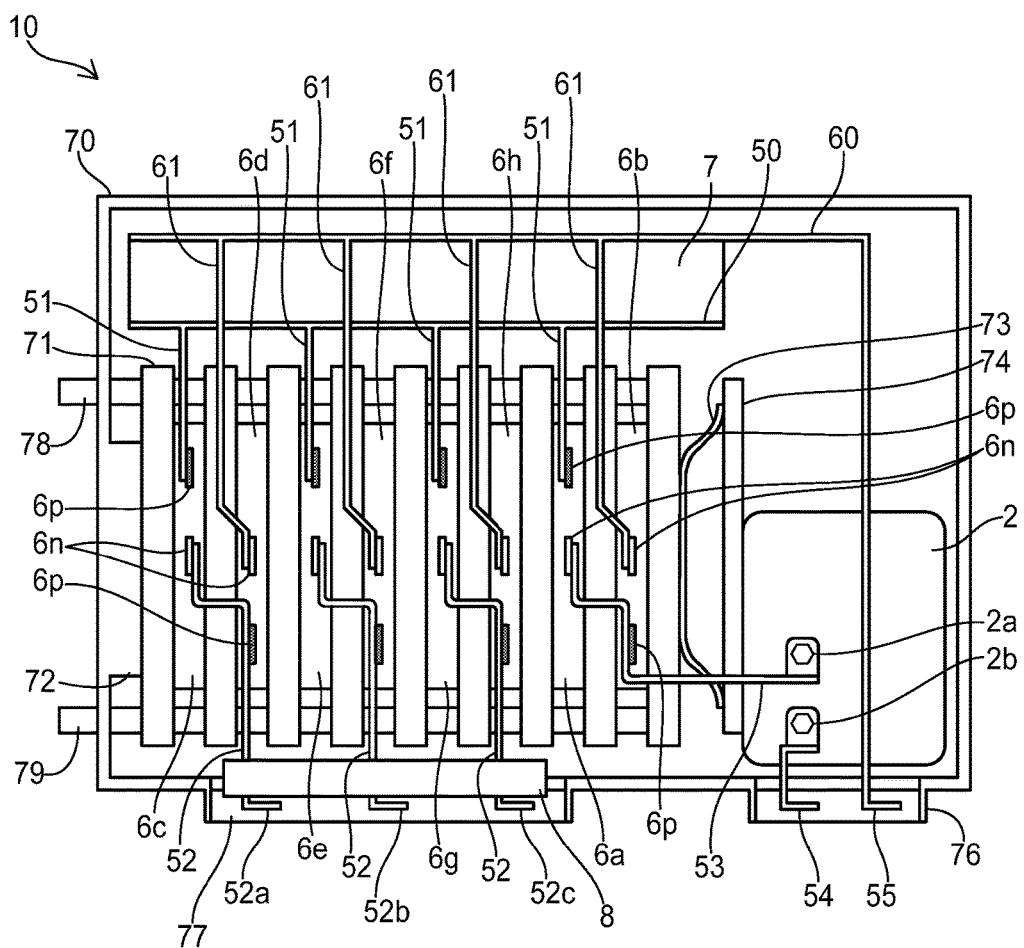
FIG. 8 is a plan view of the power converter.

Next, with reference to FIG. 8, a suitable layout of the plurality of power modules 6 and bus bars that connect the power modules 6 will be described. FIG. 8 shows a plan view of hardware of the power converter 10. FIG. 8 shows the power converter 10 with an upper cover of a case 70 removed. With reference to FIG. 8, a layout of components of the power converter 10 will be described. FIG. 8 omits illustration of the filter capacitor 5 shown in FIG. 1.

The power converter 10 is provided with the eight power modules 6a to 6h. The eight power modules 6a to 6h are stacked with a plurality of flat cooling plates 71. In FIG. 8, a sign 71 is given only to a leftmost cooling plate, and the sign is not given to the rest of the cooling plates. The power modules 6a, 6b are components of the voltage converter circuit 12, and the power modules 6c to 6h are components of the inverter circuit 13. When described without distinction from each other, the power modules 6a to 6h may be referred to as the power modules 6.

The eight power modules 6 and the plurality of cooling plates 71 are alternately stacked one after another. The eight power modules 6 are arranged such that their wide surfaces face one another. The plurality of cooling plates 71 is penetrated by two coupling pipes 78, 79. Each of the cooling plates 71 is hollow, and is supplied with cooling water from outside through the coupling pipe 78. While passing through each of the cooling plates 71, the cooling water absorbs heat from the power modules 6 adjacent thereto and is discharged to the outside through the coupling pipe 79.

The stack of the plurality of power modules 6 and the plurality of cooling plates 71 is interposed between one external wall 72 and a support wall 74 of the case 70. A leaf spring 73 is interposed between the stack and the support wall 74. The leaf spring 73 presses the stack in its staking direction. The pressure from the leaf spring 73 brings the power modules 6 and the cooling plates 71 into intimate contact with one another, by which cooling efficiency is enhanced.

In FIG. 8, the second surface 422 (the surface where the positive and the negative terminals 6p, 6n are provided) of each of the power modules 6 can be seen. In FIG. 8, signs "6p", "6n" are given only to the terminals of the leftmost two power modules 6c, 6d and the rightmost two power modules 6a, 6b, and the signs are not given to the terminals of the rest of the power modules. In FIG. 8, the positive terminals 6p is colored in gray for easier understanding.

The leftmost power module 6c in the drawing has its positive terminal 6p positioned on an upper side relative to its negative terminal 6n. The power module 6d adjacent to the power module 6c has its positive terminal 6p positioned on a lower side relative to its negative terminal 6n. This is because the power modules 6c, 6d are arranged face to face (back to back) such that their counterpart wide surfaces face each other. In other words, the power modules 6c, 6d are arranged such that their first surfaces 421 face each other. The power modules 6c, 6d may be arranged such that their third surfaces 423 face each other. In this case, the third surfaces 423 simply need to be called as "first surfaces", by which the first surfaces face each other. Next, an advantage of the layout in which the two power modules 6c, 6d are arranged face to face (back to back) will be described.

The power modules 6c, 6d constitute a part of the inverter circuit 13, and are connected in series (see FIG. 1). An alternating current is outputted from the midpoint of the series connection of the power modules 6c, 6d. A positive electrode of the series connection of the power modules 6c, 6d is connected to one of terminals of the smoothing capacitor 7 via the positive line 9p, and a negative electrode thereof is connected to the other of the terminals of the smoothing capacitor 7 via the negative line 9n. In FIG. 8, the smoothing capacitor 7 is interposed between a positive bus bar 50 and a negative bus bar 60. The positive bus bar 50 is connected to the one of the terminals of the smoothing capacitor 7, and the negative bus bar 60 is connected to the other of the terminals of the smoothing capacitor 7. Positive bus bar branches 51 extend from the positive bus bar 50, and one of them has its end connected to the positive terminal 6p of the power module 6c. Negative bus bar branches 61 extend from the negative bus bar 60, and one of them has its end connected to the negative terminal 6n of the power module 6d. One of inter-module bus bars 52 that corresponds to the midpoint of the series connection of the power modules 6c, 6d is connected to the positive terminal 6p of the power module 6d and the negative terminal 6n of the power module 6c at its one end. The inter-module bus bar 52 is connected to the current sensor 8 at its other end, passes through the current sensor 8, and constitutes a connecting terminal 52a at a connector 77.

The negative terminal 6n of the power module 6c and the positive terminal 6p of the power module 6d are connected by one bus bar (the inter-module bus bar 52). When the power modules 6c, 6d, which are connected in series, are arranged face to face (back to back), both of the positive terminal 6p of the power module 6c and the negative terminal 6n of the power module 6d are positioned on the same side relative to the inter-module bus bar 52 (on the upper side relative to the inter-module bus bar 52 in FIG. 8). This layout does not cause crossing of the bus bars to connect the positive terminal 6p of the power module 6c and the negative terminal 6n of the power module 6d to the smoothing capacitor 7, and thus simplifies arrangement of the bus bars. Specifically, the positive and the negative bus bar branches 51, 61 that connect the power modules 6c, 6d to the smoothing capacitor 7 extend toward the terminals 6p, 6n from one side of the alignment direction (a −Y side). On the other hand, the inter-module bus bar 52 that connects the negative terminal 6n of the power module 6c and the positive terminal 6p of the power module 6d to the current sensor 8 extends toward the terminals 6p, 6n from the other side of the alignment direction (a +Y side). As seen in a normal direction of the second surfaces 422 (in a Z direction), these three bus bars 51, 52, 61 do not have to cross one another.

The power modules 6a, 6b, the power modules 6e, 6f, and the power modules 6g, 6h, which are connected in series, are also arranged such that the first surfaces 421 (or the third surfaces 423) of the power modules face each other. In other words, the power modules 6a, 6b, the power modules 6e, 6f, and the power modules 6g, 6h, which are connected in series, are arranged face to face (back to back). These power modules can also achieve the same effect as that of the power modules 6c, 6d.

The power modules 6c to 6h are components of the inverter circuit 13 (see FIG. 1). The inter-module bus bar 52 that connects the negative terminal 6n of the power module 6e and the positive terminal 6p of the power module 6f is also connected to the current sensor 8, and has its end constitute a connecting terminal 52b at the connector 77. The inter-module bus bar 52 that connects the negative terminal 6n of the power module 6g and the positive terminal 6p of the power module 6h is also connected to the current sensor 8, and has its end constitute a connecting terminal 52c at the connector 77. The connecting terminals 52a to 52c respectively correspond to terminals of the midpoints of the three sets of series connections of the inverter circuit 13 (see FIG. 1). The connecting terminals 52a to 52c correspond to output terminals for the three-phase alternating current to be supplied to the electric traction motor 91.

The power modules 6a, 6b are components of the voltage converter circuit 12 (see FIG. 1). The power modules 6a, 6b are connected in series, and the power module 6a is on a high-potential side. Another inter-module bus bar 53 connects the positive terminal 6p of the power module 6b and the negative terminal 6n of the power module 6a at its one end. The other end of the inter-module bus bar 53 is connected to one end 2a of the reactor 2. The series connection of the power modules 6a, 6b is also connected to the smoothing capacitor 7. Therefore, as in the power modules 6c to 6h, the positive bus bar branch 51 is connected to the positive terminal 6p of the power module 6a, and the negative bus bar branch 61 is connected to the negative terminal 6n of the power module 6b. Both of the positive terminal 6p of the power module 6a and the negative terminal 6n of the power module 6b are positioned on the same side relative to the inter-module bus bar 53 in the alignment direction, so the three bus bars (the positive and the negative bus bar branches 51, 61, and the inter-module bus bar 53) can be arranged without crossing each other.

Another end 2b of the reactor 2 is connected to one end of an input positive bus bar 54, and the other end of the input positive bus bar 54 is positioned at an input connector 76. The negative bus bar 60 connected to the smoothing capacitor 7 is connected to an input negative bus bar 55, and one end of the input negative bus bar 55 is also positioned at the input connector 76. The input connector 76 is a connector that connects a cable from the battery 90.

Figure 9:
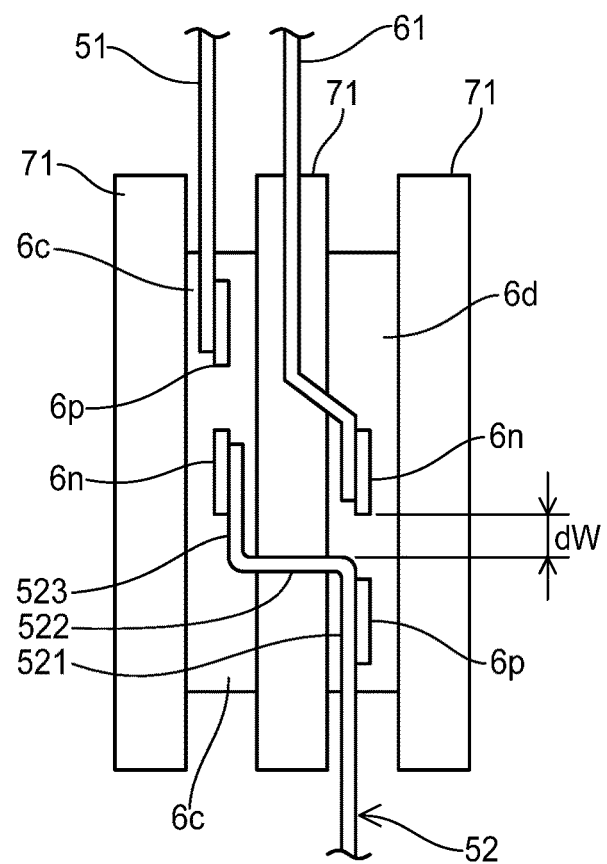
FIG. 9 is a partially enlarged view of FIG. 8.
Figure 9:
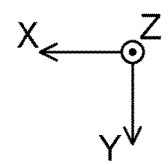

FIG. 9 shows a partially enlarged view of FIG. 8. FIG. 9 is an enlarged view of the two power modules 6c, 6d and their vicinity. FIG. 9 omits illustration of the coupling pipes 78, 79 that couple the adjacent cooling plates 71. As shown in FIG. 9, the inter-module bus bar 52 is bent in a crank shape. The inter-module bus bar 52 includes a base portion 521 extending from the current sensor 8 and connected to the positive terminal 6p of the power module 6d, a middle portion 522 bent at an end of the base portion 521 at approximately a right angle toward the power module 6c, and an end portion 523 bent at an end of the middle portion 522 so as to face the negative terminal 6n of the power module 6c. The end portion 523 is bonded to the negative terminal 6n of the power module 6c. The negative terminal 6n of the power module 6c and the positive terminal 6p of the power module 6d are connected by the inter-module bus bar 52 having a simple crank shape. Moreover, since the inter-module bus bar 52 is bent in the crank shape, an insulation distance dW can be ensured between the inter-module bus bar 52 which is electrically conductive with the positive terminal 6p of the power module 6d and the negative terminal 6n of the power module 6d.

Figure 10:
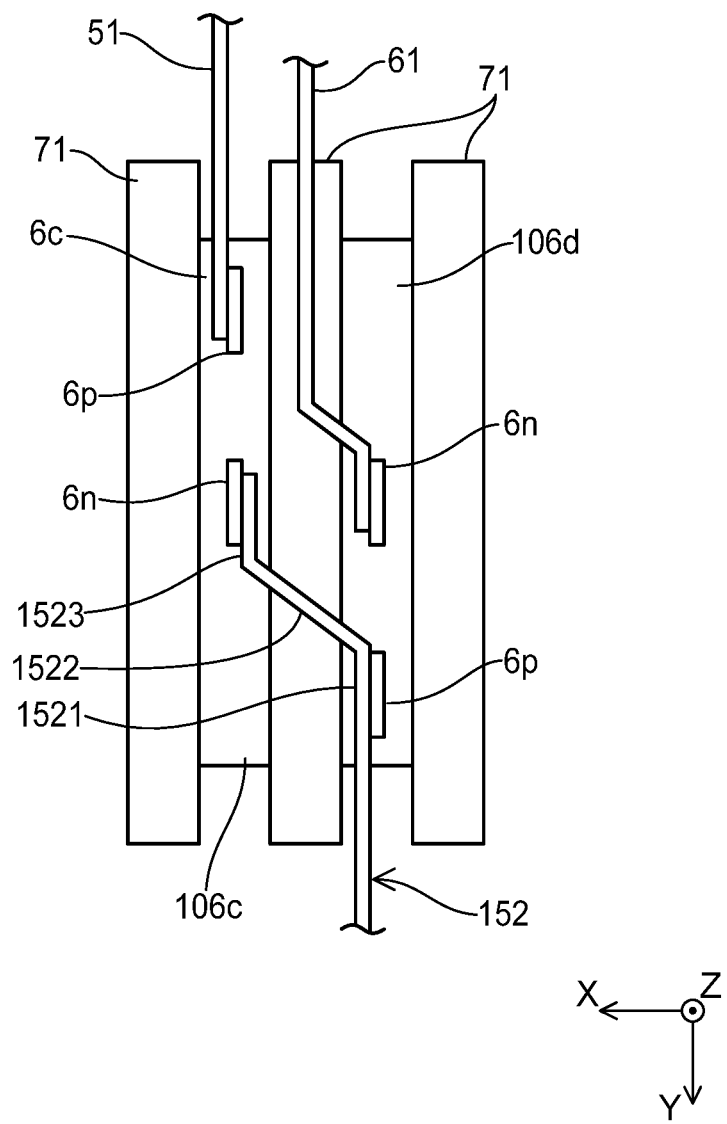
FIG. 10 is a plan view showing a variant of an inter-module bus bar.

FIG. 10 shows an inter-module bus bar 152 of a variant. FIG. 10 shows a case of adopting power modules 106c, 106d, each of which includes the positive and the negative terminals 6p, 6n spaced further apart from each other. The inter-module bus bar 152 includes a base portion 1521 connected to the positive terminal 6p of the power module 106d, a middle portion 1522 bent at an end of the base portion 1521 toward the power module 106c, and an end portion 1523 bent at an end of the middle portion 1522 so as to face the negative terminal 6n of the power module 106c. The end portion 1523 is bonded to the negative terminal 6n of the power module 106c. The middle portion 1522 does not orthogonally intersect with the base and the end portions 1521, 1523, but intersects therewith obliquely. The inter-module bus bar 152 with such a shape may be adopted.

Figure 11:
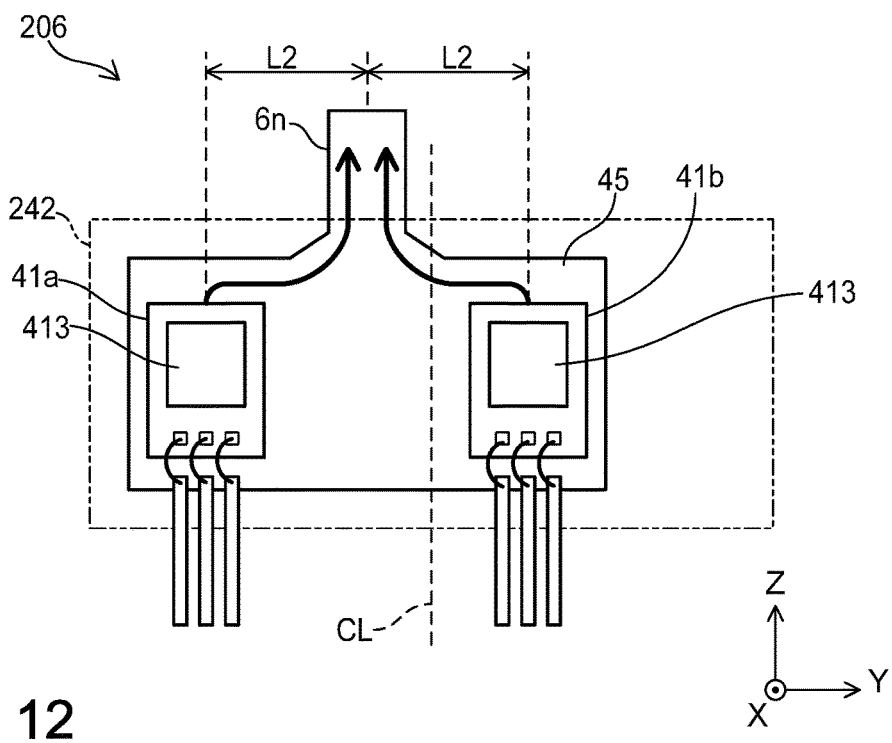
FIG. 11 is a plan view of a power module of a first variant.

Next, with reference to FIG. 11, a power module 206 of a first variant will be described. FIG. 11 is a plan view of the power module 206 of the first variant. As in FIG. 6, FIG. 11 is a diagram with a heat dissipating plate in the front in the drawing and a package removed. A package 242 is depicted with a phantom line. The power module 206 houses the two semiconductor chips 41a, 41b in the package 242. Each of the semiconductor chips 41a, 41b houses a switching element (IGBT). The two semiconductor chips 41a, 41b (the two switching elements) are aligned in the Y direction of the coordinate system in the drawing. The negative terminal 6n that connects the emitter electrodes of the two semiconductor chips 41a, 41b (the two switching elements) is arranged at a position equidistant from the semiconductor chips positioned at both ends of the alignment of the semiconductor chips, namely, from the semiconductor chips 41a, 41b. Arrows indicated by a sign "L2" in FIG. 11 show that a distance from the semiconductor chip 41a to the negative terminal 6n is equal to a distance from the semiconductor chip 41b to the negative terminal 6n.

A power converter that includes the power modules 206 of the first variant, instead of the power modules 6, also provides advantages similar to those of the power converter 10 of the embodiment. The two semiconductor chips 41a, 41b are arranged to the left in the drawing in the package 242, and the negative terminal 6n is not positioned on the center line CL of the package 242. Although the negative terminal is preferably positioned at the center of the package, the negative terminal may not be positioned at the center of the package as in the power module 206 of the first variant.

Figure 12:
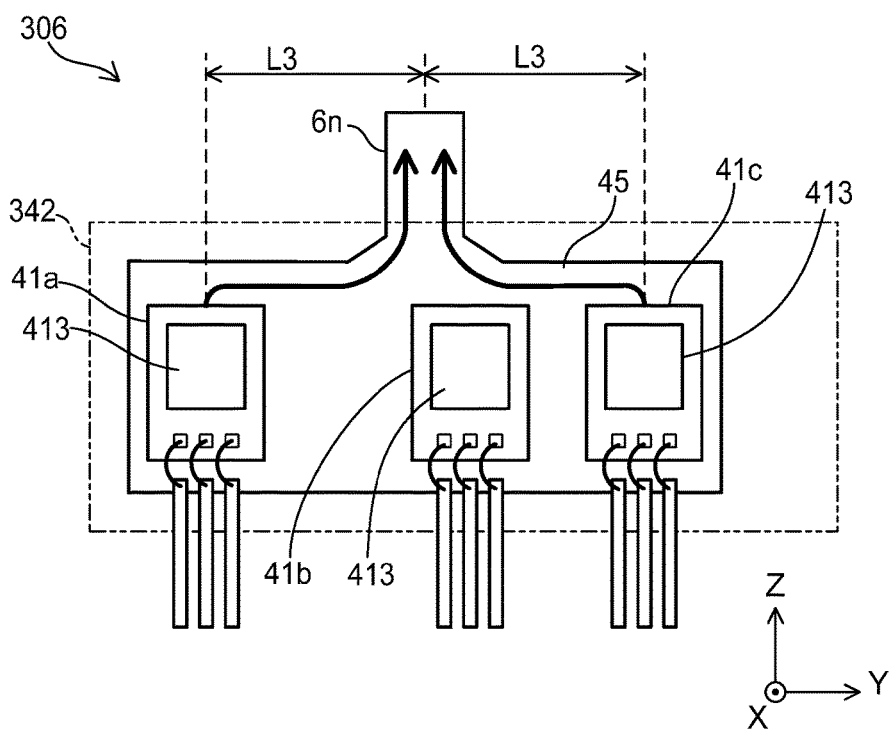
FIG. 12 is a plan view of a power module of a second variant.

Next, with reference to FIG. 12, a power module 306 of a second variant will be described. FIG. 12 is a plan view of the power module 306 of the second variant. As in FIG. 6, FIG. 12 is a diagram with a heat dissipating plate in the front in the drawing and a package removed. A package 342 is depicted with a phantom line. The power module 306 houses the three semiconductor chips 41a to 41c in the package 342. Each of the semiconductor chips 41a to 41c houses a switching element (IGBT). The three semiconductor chips 41a to 41c (the three switching elements) are aligned in the Y direction of the coordinate system in the drawing. However, a distance between the semiconductor chips 41a, 41b is not equal to a distance between the semiconductor chips 41b, 41c. The negative terminal 6n that connects the emitter electrodes of the three semiconductor chips 41a to 41c (the three switching elements) is arranged at a position equidistant from the semiconductor chips positioned at both ends of the alignment of the semiconductor chips, namely, from the semiconductor chips 41a, 41c. Arrows indicated by a sign "L3" in FIG. 12 show that a distance from the semiconductor chip 41a to the negative terminal 6n is equal to a distance from the semiconductor chip 41c to the negative terminal 6n.

A power converter that includes the power modules 306 of the second variant, instead of the power modules 6, also provides advantages similar to those of the power converter 10 of the embodiment. The three semiconductor chips 41a to 41c are arranged to the left in the drawing in the package 342, and the negative terminal 6n is not positioned on the center line of the package 342. Although the negative terminal is preferably positioned at the center of the package, the negative terminal may not be positioned at the center of the package as in the power module 306 of the second variant.

Points to be noted related to the technique described in the embodiment will be described. Each of the switching elements in the embodiment is an IGBT. However, the switching elements are not limited to IGBTs. Each switching element may be, for example, an n-channel type metal oxide semiconductor field effect transistor (MOSFET). As electrodes of the n channel-type MOSFET, a current input end is called a drain electrode, and a current output end is called a source electrode. Therefore, in a case of using a MOSFET instead of an IGBT, the emitter electrode and the collector electrode in the embodiment simply need to be called as the source electrode and the drain electrode, respectively. In the case of the n-channel type MOSFET, its gate voltage is defined with respect to a source potential, thus gate oscillations can be suppressed more with small variations in potentials of a plurality of source electrodes. Therefore, by positioning the negative terminal connecting the plurality of source electrodes at a position equidistant from the switching elements positioned at both ends of the alignment of the switching elements, the effect of suppressing gate oscillations can be achieved.

Each of the power modules of the embodiment houses the plurality of switching elements connected in parallel. A typical switching element is a transistor such as an IGBT or a MOSFET. In the embodiment, the terminal that connects the electrodes (the emitter electrodes of the n-channel type IGBTs or the source electrodes of the MOSFETs) of the plurality of transistors (switching elements) on a downstream side in a forward direction is referred to as the negative terminal, and the terminal that connects the electrodes of the plurality of transistors on an upstream side in the forward direction is referred to as the positive terminal.

Some features of the power converter 10 described in the embodiment will be summarized below. The power converter 10 includes the plurality of power modules 6. Each of the power modules 6 houses the plurality of switching elements connected in parallel. Each of the power modules 6 is flat, and is provided with the first surface 421 (a first wide surface), the second surface 422 (a narrow surface) intersecting with the first surface 421, and the third surface 423 (a second wide surface) parallel to the first surface 421. The plurality of switching elements is connected in parallel by the first heat dissipating plate 44 exposed at the first surface 421 and the second heat dissipating plate 45 exposed at the third surface 423. The plurality of switching elements is aligned in a line in the direction (the alignment direction) parallel to both of the first and the second surfaces 421, 422. The negative terminal 6n that connects the emitter electrodes (the source electrodes) of the plurality of switching elements extends from the second surface 422 at a position equidistant from the emitter electrodes of the switching elements positioned at both ends of the alignment of the switching elements. The positive terminal 6p that connects the collector electrodes (the drain electrodes) of the plurality of switching elements is arranged adjacent to the negative terminal 6n in the alignment direction at the second surface 422.

The plurality of power modules 6 and the plurality of cooling plates 71 are alternately stacked one after another. The adjacent power modules (e.g., 6c, 6d) are arranged face to face (back to back) such that their first surfaces 421 (or third surfaces 423) face each other. The same applies to other adjacent power modules (e.g., 6a, 6b). By arranging the adjacent power modules (e.g., 6c, 6d) face to face (back to back), their negative terminals 6n face each other, but their positive terminals 6p do not face each other. The negative terminal 6n of one (e.g., 6c) of the power modules and the positive terminal 6p of the other (e.g., 6d) of the power modules are connected by the bus bar (the inter-module bus bar 52) that extends from one side of the alignment direction. The positive terminal 6p of the one (e.g., 6c) of the power modules and the negative terminal 6n of the other (e.g., 6d) of the power modules are connected to another component (the smoothing capacitor 7) by the bus bars (the positive and the negative bus bar branches 51, 61) that extend from the other side of the alignment direction. The bus bar (the inter-module bus bar 52) that extends from the one side of the alignment direction toward the terminals 6p, 6n, and the bus bars (the positive and the negative bus bar branches 51, 61) that extend from the other side of the alignment direction toward the terminals 6p, 6n can be connected to their corresponding power modules, without crossing each other as seen in the normal direction of the second surfaces 422.

The power module 6c corresponds to an example of a first housing, and the power module 6d corresponds to an example of a second housing. The power module 6a corresponds to another example of the first housing, and the power module 6b corresponds to another example of the second housing.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed.

Further, the art described in the description and the drawings may concurrently achieve a plurality of aims, and technical significance thereof resides in achieving any one of such aims.

What is claimed is:
1. A power converter comprising:
a first housing and a second housing, each of which houses a plurality of switching elements connected in parallel,
wherein
each of the first and the second housings is provided with a first surface and a second surface, the second surface intersecting with the first surface,
the first and the second housings are arranged such that the first surface of the first housing faces the first surface of the second housing,
in each of the first and the second housings, the plurality of switching elements is aligned in an alignment direction which is parallel to both of the first and the second surfaces,
an emitter terminal or a source terminal of parallel connection of the plurality of switching elements extends from the second surface at a position equidistant from the switching elements positioned at both ends in the alignment direction among the plurality of switching elements, and
a collector terminal or a drain terminal of the parallel connection is positioned adjacent to the emitter or the source terminal in the alignment direction.

2. The power converter according to claim 1 further comprising:
a bus bar connecting another device with the emitter or the source terminal of the first housing and the collector or the drain terminal of the second housing,
wherein the bus bar includes:
a base portion connected to the collector or the drain terminal of the second housing;
a middle portion bent at an end of the base portion toward the first housing; and
an end portion bent at an end of the middle portion so as to face the emitter or the source terminal of the first housing, and connected to the emitter or the source terminal of the first housing.

3. The power converter according to claim 2, wherein the bus bar is bent in a crank shape.

4. The power converter according to claim 1, wherein the plurality of switching elements is arranged at regular intervals in each of the first and the second housings.

5. The power converter according to claim 1, wherein the first and the second housings are power modules.

* * * * *